(12) United States Patent
Yamasaki et al.

(10) Patent No.: US 8,164,693 B2
(45) Date of Patent: Apr. 24, 2012

(54) LINE MEMORY PACKAGING APPARATUS AND TELEVISION RECEIVER

(75) Inventors: Masaya Yamasaki, Hachioji (JP); Yoshihiko Ogawa, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1280 days.

(21) Appl. No.: 11/812,453

(22) Filed: Jun. 19, 2007

(65) Prior Publication Data

US 2007/0296872 A1 Dec. 27, 2007

(30) Foreign Application Priority Data

Jun. 23, 2006 (JP) ................................. 2006-173922

(51) Int. Cl.
*H04N 9/64* (2006.01)

(52) U.S. Cl. ........................................ 348/717; 348/716

(58) Field of Classification Search .................. 348/714, 348/716–718, 571, 708, 441, 458; 345/536–538, 345/544, 549, 564, 571; 326/39, 40; 711/5, 711/170–173

See application file for complete search history.

(56) References Cited

U.S. PATENT DOCUMENTS

| 4,282,546 | A | * | 8/1981 | Reitmeier | 348/580 |
|---|---|---|---|---|---|
| 4,405,946 | A | * | 9/1983 | Knight | 348/570 |
| 4,587,558 | A | * | 5/1986 | Sugiyama et al. | 348/718 |
| 4,745,462 | A | * | 5/1988 | Dischert et al. | 348/717 |
| 4,747,081 | A | * | 5/1988 | Heilveil et al. | 365/219 |
| 5,315,388 | A | * | 5/1994 | Shen et al. | 348/718 |
| 5,510,857 | A | * | 4/1996 | Kopet et al. | 348/699 |
| 5,587,742 | A | * | 12/1996 | Hau et al. | 348/441 |
| 5,638,128 | A | * | 6/1997 | Hoogenboom et al. | 375/240.15 |
| 5,804,986 | A | * | 9/1998 | Jones | 326/40 |
| 6,088,047 | A | * | 7/2000 | Bose et al. | 345/547 |
| 6,333,750 | B1 | * | 12/2001 | Odryna et al. | 345/629 |
| 6,798,420 | B1 | | 9/2004 | Xie | |
| 7,256,790 | B2 | * | 8/2007 | Valmiki et al. | 345/530 |
| 2003/0112367 | A1 | * | 6/2003 | Kang et al. | 348/441 |
| 2004/0095598 | A1 | | 5/2004 | Snell | |
| 2004/0096108 | A1 | | 5/2004 | Park | |
| 2005/0074074 | A1 | * | 4/2005 | Limberg | 375/285 |
| 2006/0101231 | A1 | | 5/2006 | Higashida | |

FOREIGN PATENT DOCUMENTS

| EP | 0 44 947 A2 | 9/1991 |
|---|---|---|
| JP | 08-125818 | 5/1996 |
| JP | 09-330267 | 12/1997 |

(Continued)

OTHER PUBLICATIONS

European Search Report dated Jul. 17, 2008 for Appln. No. 07110519.1-2202.

(Continued)

*Primary Examiner* — Victor Kostak

(74) *Attorney, Agent, or Firm* — Pillsbury Winthrop Shaw Pittman, LLP

(57) ABSTRACT

According to one embodiment, using several random access memory components, these several RAM components are integrally driven to form a logical line memory. The number of using RAM components is reduced to the minimum, and thereby, hardware cost is reduced. A line memory forming apparatus comprises cascade-connected several RAM components, several line memories logically serial-connected in a manner that of the several RAM components, part of an output of the final-stage RAM component and part of an input of the first-stage RAM component are provided with several connection portions, and a controller controlling write address and read address of the several RAM components to drive the line memories.

8 Claims, 12 Drawing Sheets

FOREIGN PATENT DOCUMENTS

| | | |
|---|---|---|
| JP | 10-340340 | 12/1998 |
| JP | 2000-23107 | 1/2000 |
| JP | 2000-242549 | 9/2000 |
| JP | 2005-123689 | 5/2005 |
| JP | 2005-268886 | 9/2005 |
| JP | 2006-72449 | 3/2006 |

OTHER PUBLICATIONS

Japanese Office Action dated Nov. 22, 2011.

* cited by examiner

B : Bit width   W : Word length
P : Depth

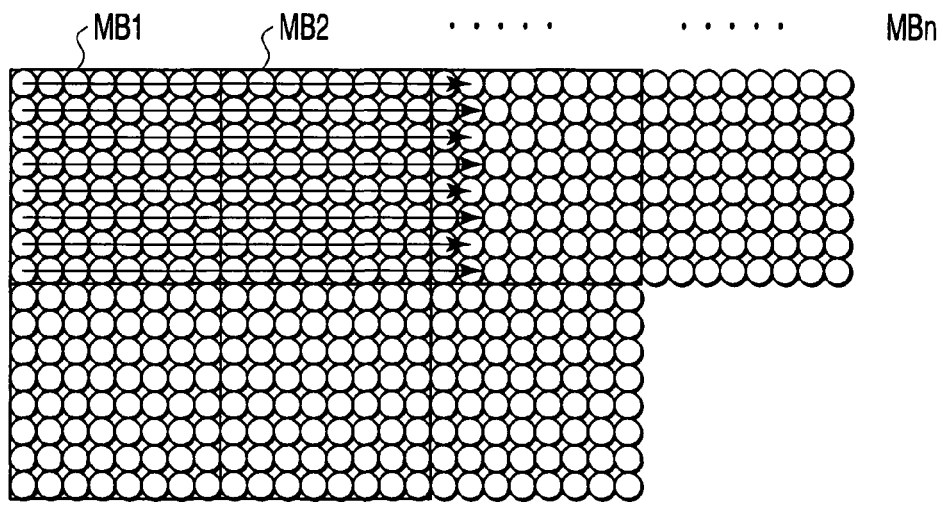
F I G. 9 A
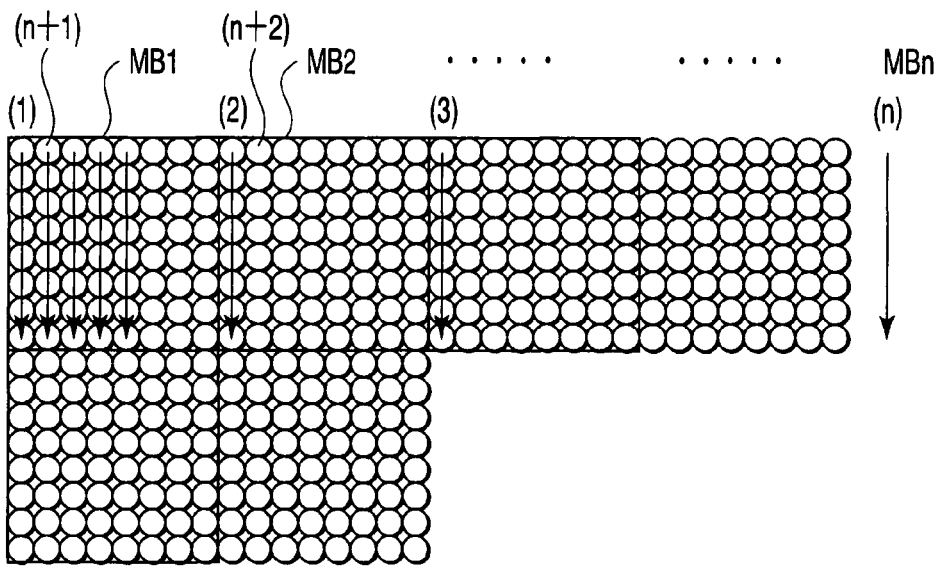
F I G. 9 B

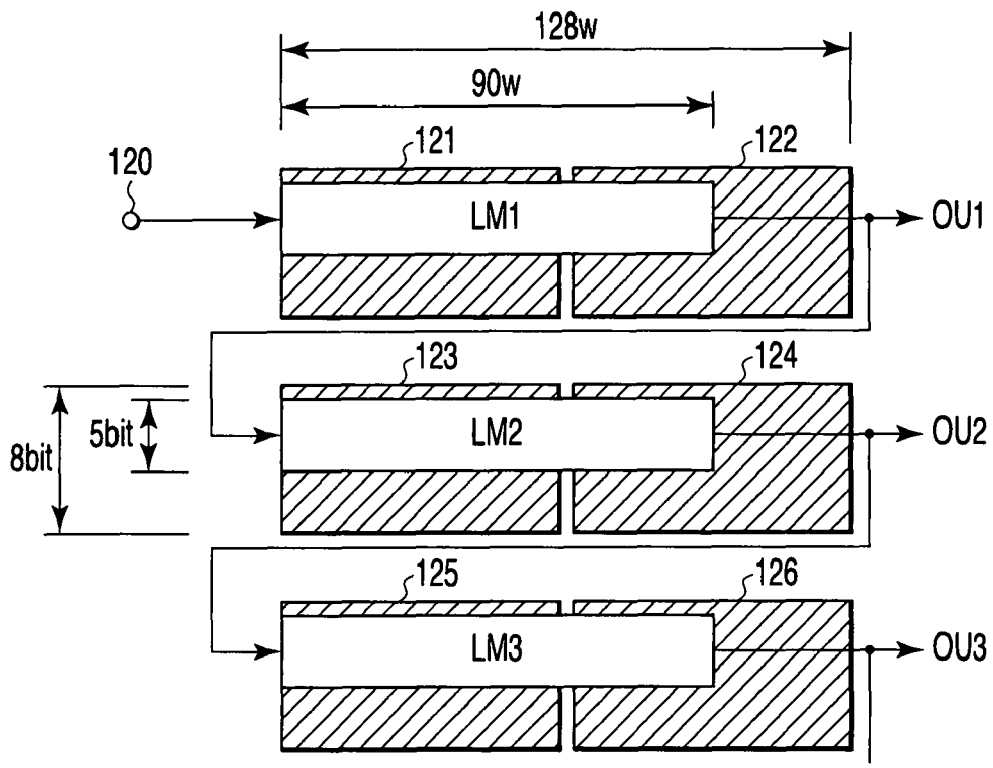
F I G. 11 A
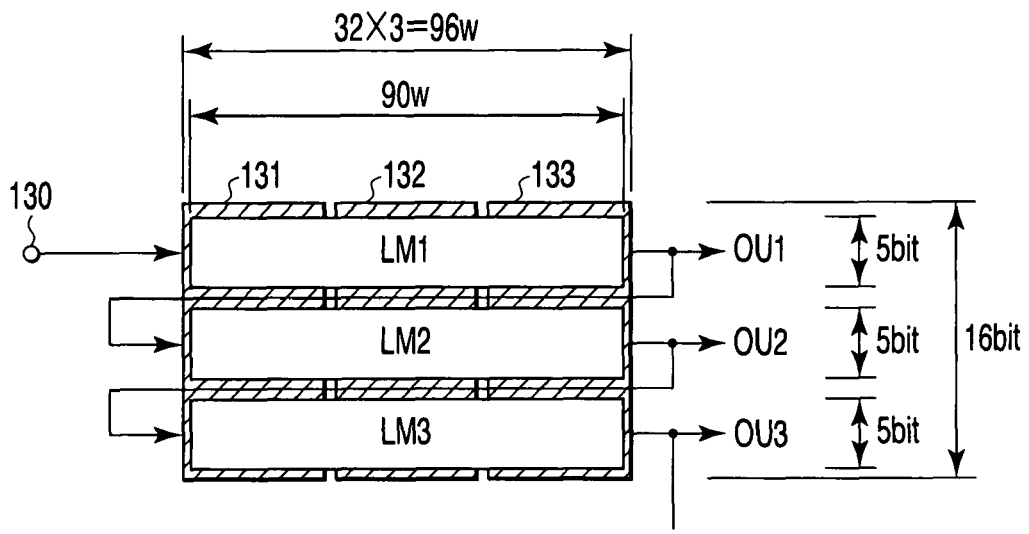
F I G. 11 B

LINE MEMORY PACKAGING APPARATUS AND TELEVISION RECEIVER

CROSS-REFERENCE TO RELATED APPLICATIONS

This application is based upon and claims the benefit of priority from Japanese Patent Application No. 2006-173922, filed Jun. 23, 2006, the entire contents of which are incorporated herein by reference.

BACKGROUND

1. Field

One embodiment of the invention relates to a line memory packaging apparatus, and to a television receiver. In particular, the present invention relates to a technique of forming a logical line memory with respect to hardware using several RAM components.

2. Description of the Related Art

A line memory is used for various operators processing video data in a video signal processor. For example, the line memory has a bit width of 8 or 16 bits and a bit length corresponding to the number of pixels equivalent to horizontal one line. A circuit using several line memories is used for converting and changing over vertical resolution. Moreover, several line memories are used as a filtering circuit (e.g., Jpn. Pat. Appln. KOKAI Publication No. H10-340340).

According to the foregoing conventional technique, several line memories is mainly used for processing data delay. Basically, one line memory is handled as a first-in first-out (FIFO) buffer. For this reason, the array number of a first-stage line memory is designed in accordance with the input bit width and input pixels of an operator using an output of several line memories. Several line memories each set a read/write point.

BRIEF DESCRIPTION OF THE SEVERAL VIEWS OF THE DRAWINGS

A general architecture that implements the various features of the invention will now be described with reference to the drawings. The drawings and the associated descriptions are provided to illustrate embodiments of the invention and not to limit the scope of the invention.

FIGS. 9A and 9B are views to explain the method of reading pixel data when a pixel block is supplied to a line memory group;

FIGS. 11A and 11B are views to explain how to select a RAM component in accordance with design requirements in order to clarify the effect of the invention;

DETAILED DESCRIPTION

Various embodiments according to the invention will be described hereinafter with reference to the accompanying drawings.

According to one embodiment, there is provided a line memory forming apparatus comprising: cascade-connected several RAM components; several line memories logically serial-connected in a manner that of said several RAM components, part of an output of the final-stage RAM component and part of an input of the first-stage RAM component are provided with several connection portions; and a controller controlling write address and read address of said several RAM components to drive the line memories.

According to the foregoing configuration, a depth (bit) of the line memory is assigned to a bit width of the RAM component.

(1) By doing so, several line memories are formed on several RAM components without independently preparing the line memory. Thus, these RAM components are effectively used, and moreover, a degree of freedom is high when the number of columns of line memory is set. This serves to reduce hardware cost.

(2) When logical several line memories are assigned to several RAM components, assignment is effectively designed, and thereby, the apparatus is realized using the minimum number of RAM components. This serves to effectively use the RAM components, and to reduce hardware cost.

Figure 1:
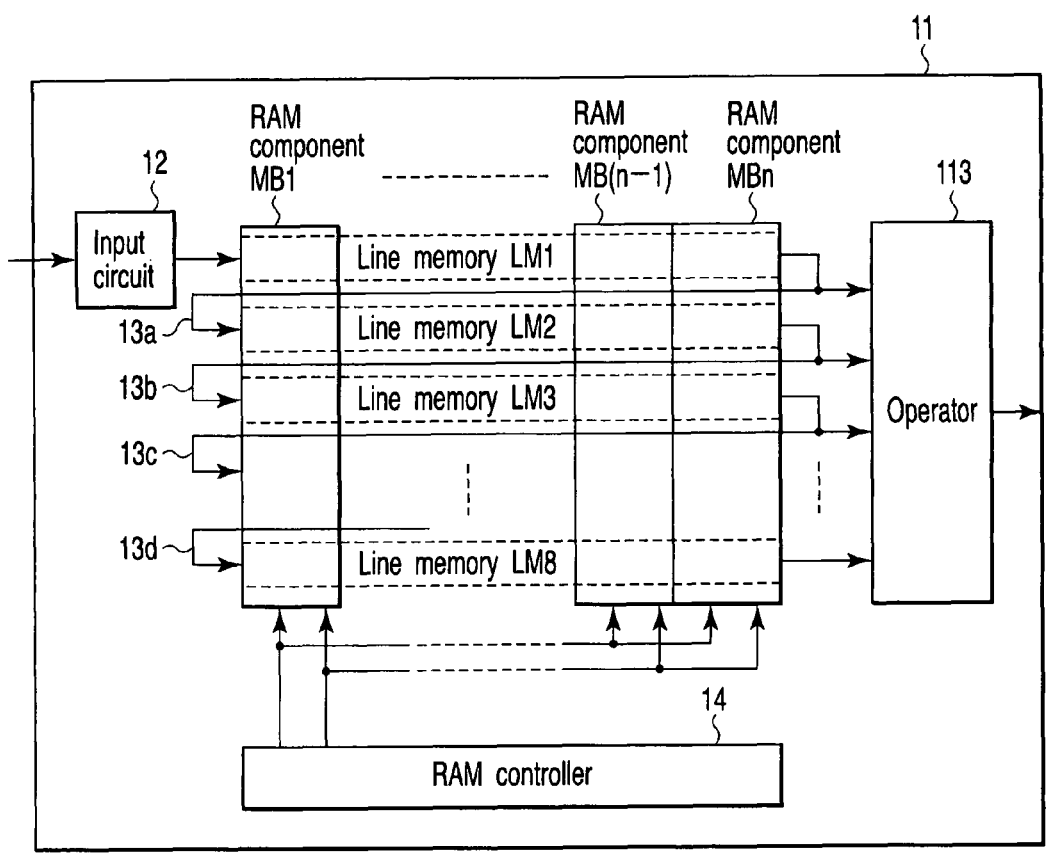
FIG. 1 is a view to explain the configuration of one embodiment according to the invention.

One embodiment of the invention will be described hereinafter with reference to the accompanying drawings. FIG. 1 shows one embodiment. In FIG. 1, a reference numeral 11 denotes a circuit substrate or large-scale integration (LSI) circuit. Image data is input to a random access memory (RAM) component MB1 via an input circuit. For example, n RAM components RAM1 to RAMn are cascade (or column)-connected, and mounted on a substrate.

The data input side is provided with several connections (i.e., connection lines 13a to 13d). Of several RAM components MB1 to MBn, the connection line is provided on an output side of the final-stage RAM component MBn and an input side of the first-stage RAM component MB1.

The foregoing connection and write/read address control are used, and thereby, several (N: e.g., 8) line memories LM1, LM2 ... and LM8 are logically formed in series. Specifically, the output of the line memory LM1 is input to the line memory LM2, and moreover, the output of the line memory LM2 is input to the line memory LM3. In the foregoing line memory group, line memories LM1 to LM8 are equivalent to be connected in series.

A reference numeral 14 denotes a RAM controller. The RAM controller 14 supplies write address and read address to RAM components MB1 to MBn. The output of the final stage of each output of line memories LM1 to LM8 is input to an operator 113. Then, the operator 113 carries out various processings, that is, filtering, or pixel interpolation, compression, Y/C separation with respect to the foregoing output.

For example, the foregoing circuit is given as a circuit, which successively processes data equivalent to 8 lines. In this case, outputs of line memories LM1 to LM8 are simultaneously input to the operator 113 in synchronism with the processing speed of the operator 113. For example, the operator 113 can simultaneously capture image data of 8-bit×8 (8 pixels in one column). For example, if images equivalent to two columns are captured, the operator 113 executes an average operation of 2×2 pixel to make resolution conversion.

The operator 113 operates pixel data equivalent to (8 bits×8 rows), and then, outputs the result. As described above, when pixel macro block processing is completed; the next pixel data is prepared.

As described above, according to the foregoing line memory packaging, of serial-connected several (N) line memories LM1 to LM8, row n (n=N in FIG. 1) line memories are formed in the cascade-connected several RAM components MB1 to MBn.

Here, the pixel macro block is set as {8(row=pixel)×8 (pixel)}: (8 bit per pixel) Data processing of the foregoing circuit is carried out as an image shown in FIG. 2.

Figure 2:
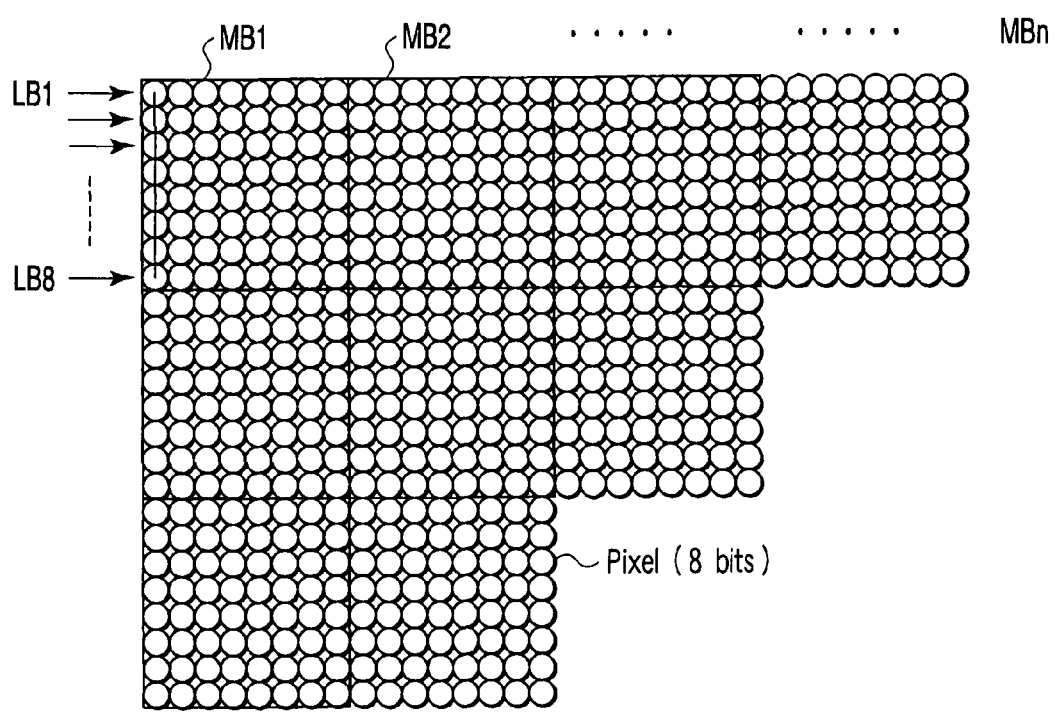
FIG. 2 is a view showing a pixel block corresponding to a RAM component processed by the apparatus of FIG. 1.

FIG. 2 shows a state of a pixel macro blocks such that pixels equivalent to one screen is divided corresponding to each of RAM components MB1, MB2 . . . MBn. The pixel macro block is stored in line memories LM1 to LM8 based on the control of the RAM controller 14.

In FIG. 2, one pixel macro block has a width of 8 (pixel) (or bit width), a depth of 8 (pixel) (or number of words), and each pixel has 8 bit-data. On the other hand, the line memory has 8 bit×8 (row) as seen from LM1 to LM8.

Figure 3:
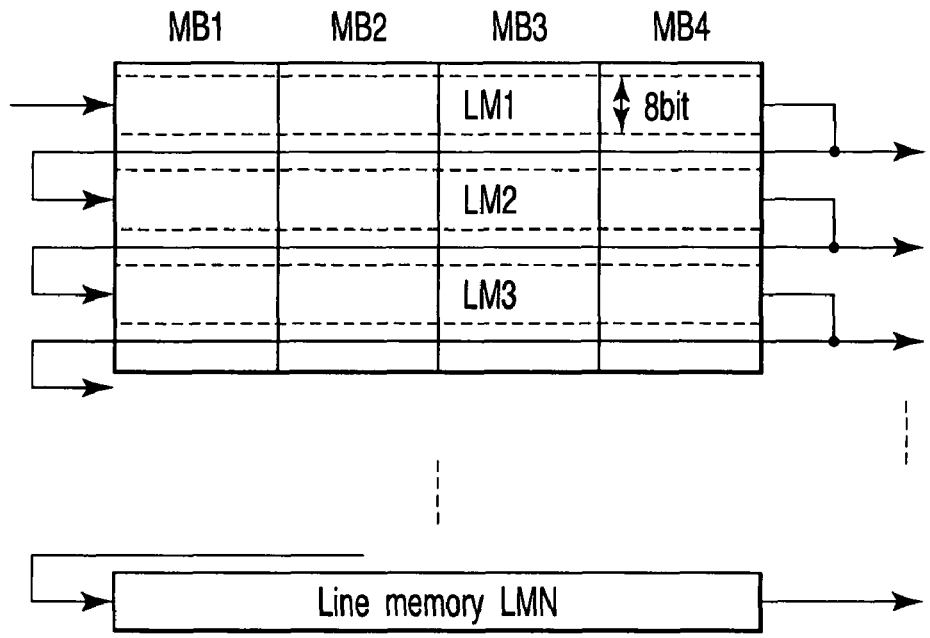
FIG. 3 is a view showing a state that several line memories are assigned to several rectangular RAM components.
Figure 4:
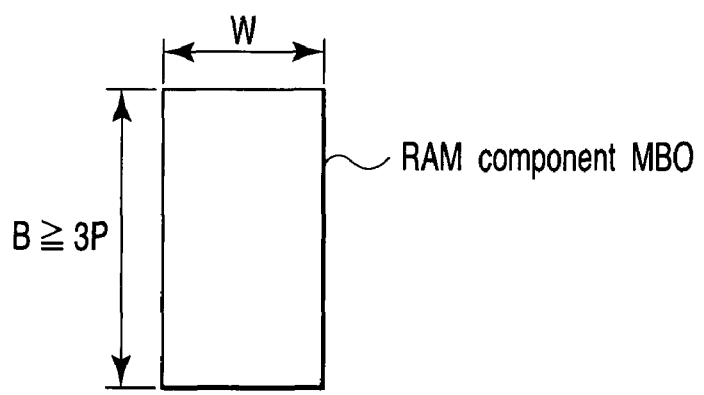
FIG. 4 is a view showing one example of the RAM component.

FIG. 3 shows a state that LM1 to LM3 of line memories LM1 to LMN are assigned to four cascade-connected RAM components MB1 to MB4. FIG. 4 shows an example of one RAM component MB0. The bit width of one line memory is set as P bit, and the length thereof is set as H bit. The bit width of the RAM component is 3P, and the depth (length) thereof is W (rectangular type). For example, the length H of the line memory is equivalent to 4W.

As illustrated in FIG. 3, areas of line memories LM1 to LM3 are secured with respect to four RAM components MB1 to MB4.

As described above, part of several line memories LM1 to LM3 is received in one RAM component MB0. By doing so, the RAM controller simultaneously executes input/output control of several line memories LM1 to LM3 using a pair of write pointer WP and read pointer RP.

The number of rows of the line memory is preferably designed considering the following point. Specifically, the number of rows is collectively received in at least bit width of the RAM component. This is because several RAM components are cascade-connected, and effectively assigned to the logical line memory group in hardware. Of course, there exists the case where the number of rows is not received in the bit width of the RAM component having the total number of rows of the line memory. Even if such a case is given, several RAM components are cascade-connected, and further, connected in parallel. By doing so, it is obvious that assignment is effectively made.

According to the foregoing configuration, the bit width direction of the RAM component coincides with the row direction of several line memories, and the depth (number of words) direction coincides with the lengthwise direction thereof. The concept of the invention is not limited to the foregoing configuration. For example, the bit width direction of the RAM component coincides with the lengthwise direction of several line memories, and the depth (number of words) direction coincides with the row direction thereof.

The foregoing assignment is possible using address control by the controller 14 with respect to several RAM components. On the other hand, the operator on the output side of the linememory group is classified into the following two cases. One is the case of simultaneously capturing several pixels arrayed in the horizontal direction. Another is the case of simultaneously capturing several pixels arrayed in the vertical direction.

Figure 5A:
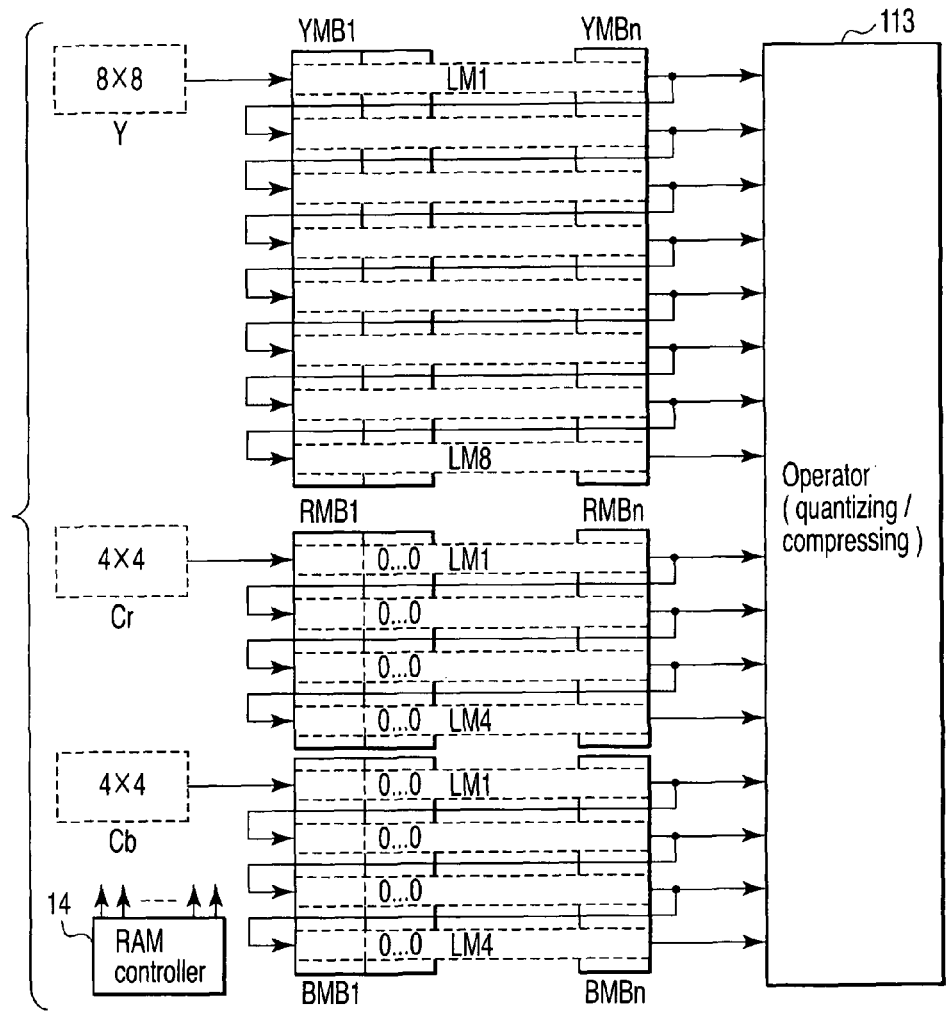
FIGS. 5A and 5B are views to explain a circuit block and a pixel block according to another embodiment.
Figure 5B:
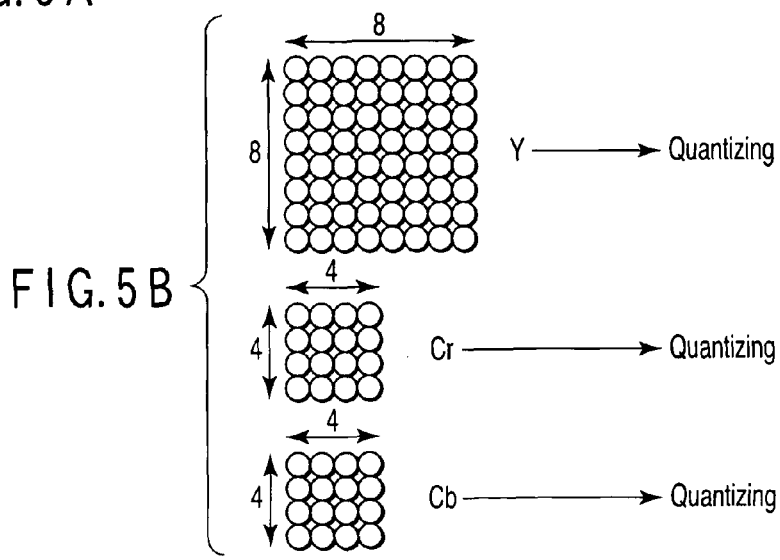

FIG. 5A is a view showing the configuration of a circuit processing a luminance signal Y and color difference signals Cr, Cb at a unit of a pixel macro block. As depicted in FIG. 5B, the luminance signal is quantized for the purpose of compression at (8 pixels×8 pixels) unit. On the other hand, the color difference signal is quantized for the purpose of compression at (4 pixels×4 pixels) unit. In such a case, (8 pixels×8 pixels), (4 pixels×4 pixels) and (4 pixels×4 pixels) are set.

Thus, cascade-connected RAM components YMB1 to YMBn, cascade-connected RAM components RMB1 to RMBn and cascade-connected RAM components BMB1 to BMBn are used. As shown in FIG. 5A, having 8-row line memories LM1 to LM8, four-row Line memories LM1 to LM4 and four-row line memories LM1 to LM4 are built up as a line memory. The foregoing line memory configuration is given, and thereby, each pixel macro block of luminance signal Y, color difference signals Cr and Cb are assigned to several line memories. By doing so, hardware design is effectively possible, and a circuit is configured without wasteful area. In order to synchronize processing timing of luminance signal Y, color difference signals Cr and Cb, data-all-zero pixel macro block may be used as the pixel macro block of the foregoing signals Cr and Cb.

Figure 6:
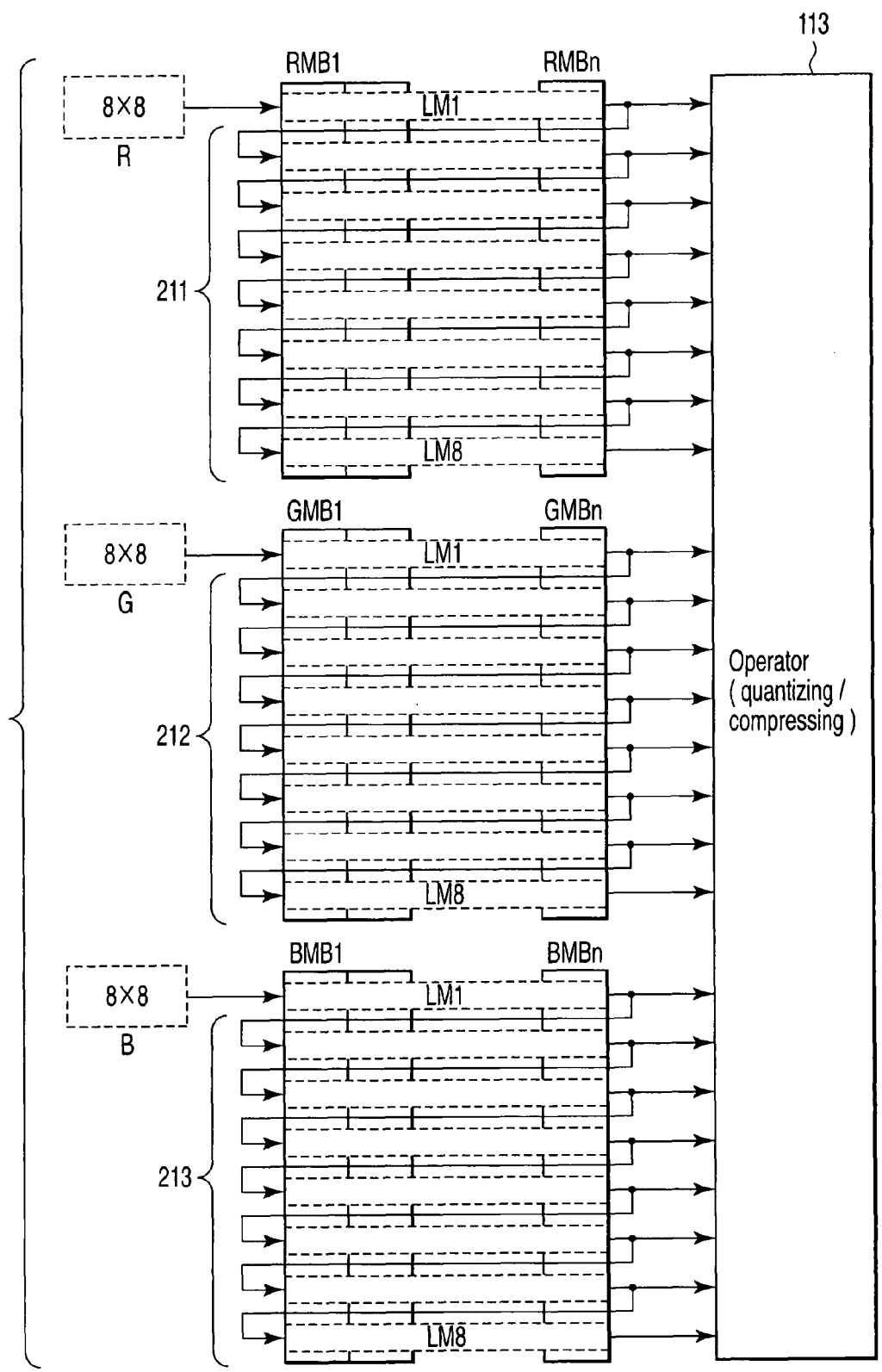
FIG. 6 is a circuit diagram showing the configuration of still another embodiment of the present invention.

FIG. 6 is a view showing the configuration of a RGB processor circuit, which is capable of handling a block having 8 pixels×8 pixels as a pixel macro block. A line memory group 211 formed in RAM components RMB1 to RMBn handles an R pixel. A line memory group 212 formed in RAM components GMB1 to GMBn handles a G pixel. A line memory group 213 formed in RAM components BMB1 to BMBn handles a B pixel. An operator 113 is not limited to a quantizer, and a filter may be used. RMB1 to RMBn each functions as an R pixel macro block, GMB1 to GMBn each functions as a G pixel macro block, and BMB1 to BMBn each functions as a B pixel macro block.

Figure 7:
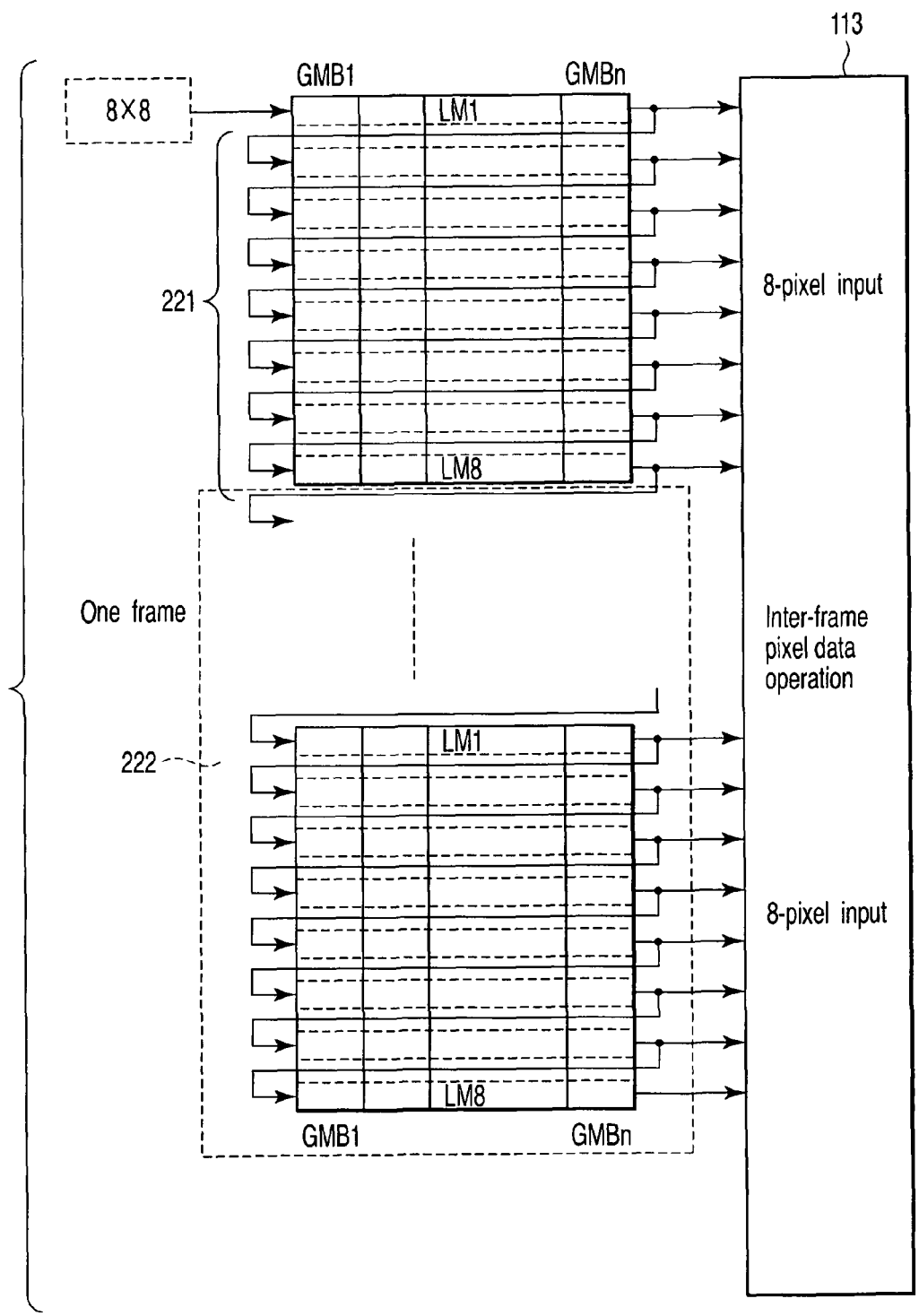
FIG. 7 is a circuit diagram showing the configuration of still another embodiment of the present invention.

FIG. 7 shows the configuration of an inter-frame pixel data operator given as the operator 113. A line memory group 221 forms a time control circuit, and a line memory group 222 forms a frame delay circuit. GMB1 to GMBn are RAM components. Data equivalent to 8 line of each frame exists; therefore, delay between 221→222 may be controlled using another means.

The foregoing configuration is given, and thereby, the operator 113 can simultaneously capture output pixel (8 pixels) of one column (one RAM component) and one column pixel (8 pixels) before one frame. In other words, according to the foregoing circuit configuration, the pixel macro block of the current block is compared with the corresponding pixel macro block before one frame. This serves to obtain image motion information. Of course, the using frame is not limited to two frames, that is, the current frame and the previous frame. In this case, processing is carried out using many frames.

Figure 8:
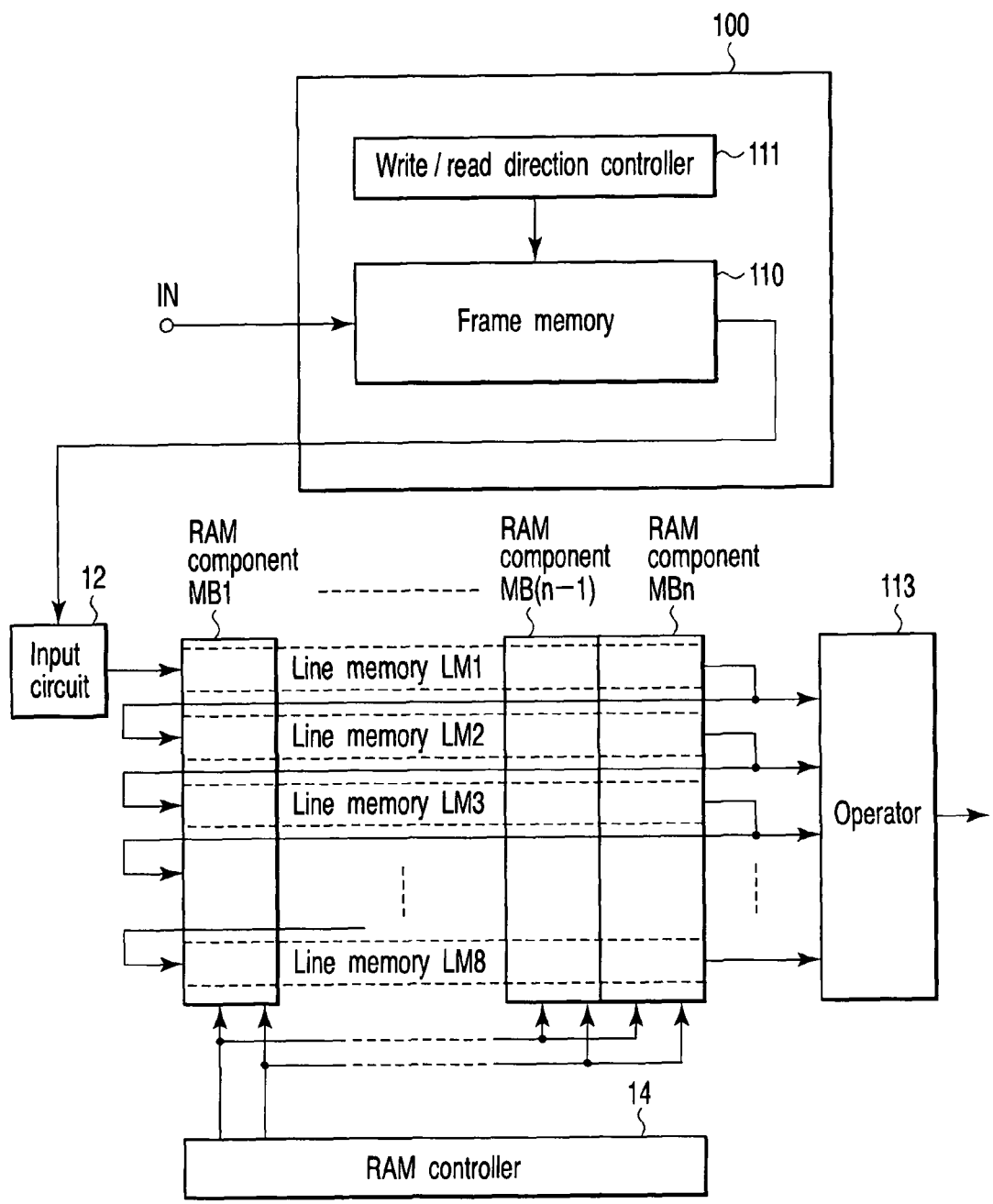
FIG. 8 is a circuit diagram showing the configuration of still another embodiment of the present invention.

FIG. 8 shows another embodiment of the invention. According to this embodiment, a pre-stage of an input circuit 12 is provided with an input controller 100. The input controller 100 is used to easily execute various processings, that is, image rotation, inclination, inversion of right and left or up and down, reduction and enlargement. Image data is previously stored in a frame memory 110. In this case, the frame controller controls read address or write address to execute image rotation, inclination, inversion of right and left or up and down, reduction and enlargement. Thereafter, the frame controller is realized as a circuit, which executes filtering using several line memories formed in a RAM component group and an operator 113.

In FIG. 9A, a read direction is shown by arrows when pixel data is read from the frame memory of FIG. 8. In this case, the pixel data is read for each row. When 8-row pixel data is read, RAM components MB1 to MBn shown in FIG. 8 are determined. The pixel macro block executing the foregoing read is effective in the case where vertical filtering or line interpolation is made.

The present invention is not limited to formation of the foregoing macro pixel block. For example, pixel data may be read from the frame memory 110 along the direction shown by arrows of FIG. 9B. Pixel data is read, and then, developed on line memories LM1 to LM8. In this case, this is effective in the following processing. Specifically, the pixel macro block is effective in horizontal filtering or in the case of generating horizontal interpolation pixel.

The present invention is not limited to the foregoing embodiment. The number of vertical and horizontal pixels of the RAM component is not limited to 8×8, 16×16, 4×4. Of course, the different number of vertical and horizontal pixels may be given.

Figure 10:
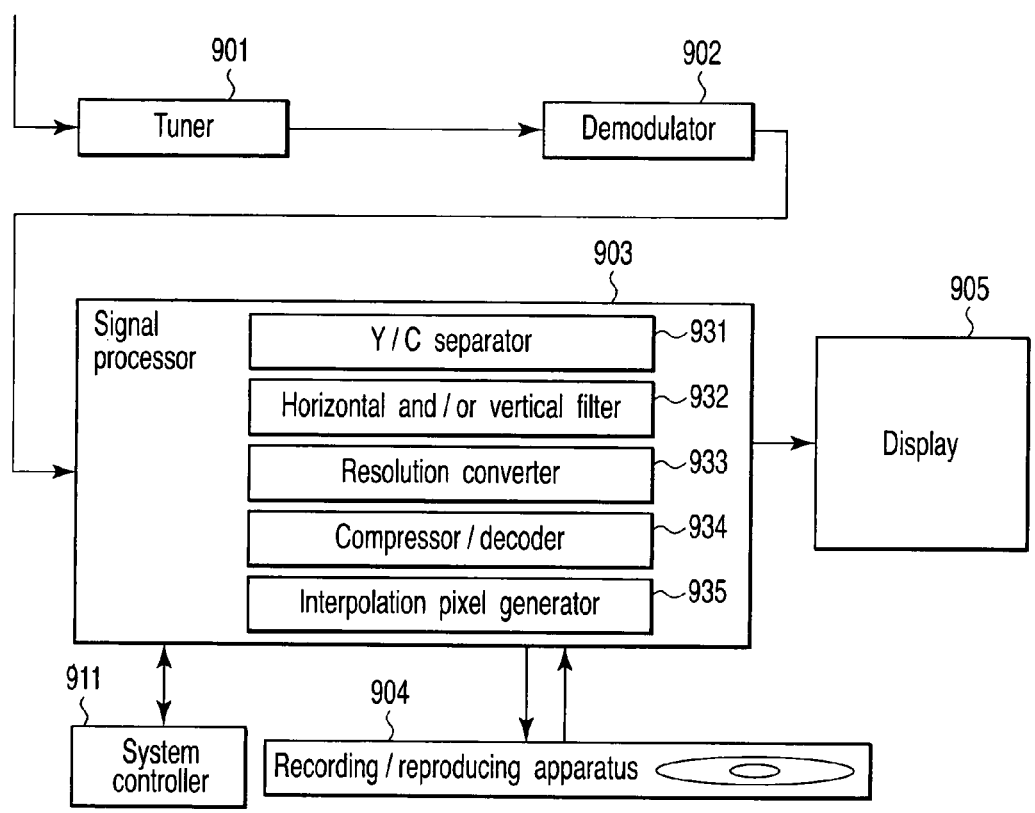
FIG. 10 is a block diagram showing the configuration of a television receiver to which the present invention is applied.

FIG. 10 shows a television receiver to which the invention is applied. A signal received by a tuner 901 is input to a demodulator 902. The demodulator 902 obtains a baseband digital video signal. The video signal is input to a signal processor 903. The signal processor executes signal processings suitable for display. Specifically, various processings, for example, filtering, control of luminance signal and color signal and resolution conversion are carried out. A signal recorded in a recording/reproducing apparatus 904 is compressed via a compressor/decoder 934. When the signal of the recording/reproducing apparatus 904 is reproduced, decoding is carried out. A system controller 911 collectively controls the operation of the signal processor 903. A display signal output from the signal processor 903 is input to a display 905.

The signal processor 903 includes Y/C separator 931, horizontal/vertical filter 932, resolution converter 933, compressor/decoder 934 and interpolation pixel generator 935. The interpolation pixel generator 935 converts an aspect ratio to change the number of lines and to improve motion characteristic. In this case, there is no need of providing the foregoing entire Y/C separator 931 to interpolation pixel generator 935. Part of their components is only realized. The line memory group is used in these blocks. The configuration of the line memory group is as shown in FIGS. 1 to 8. The Y/C separator 931 has two processing parts. One is a processing part of adding image data before and after one line. Another is a processing part of subtracting the same as above. By doing so, the Y/C separator 931 separates the signal into luminance signal and color signal component. The separated luminance signal and color signal component are demodulated, and filtered via the horizontal/vertical filter 932. Moreover, the resolution converter 933 executes resolution conversion. The compressor/decoder 934 compresses image data for a recording signal. The interpolation pixel generator 935 converts an aspect ratio and the number of lines, and makes an operation between spatial or time adjacent pixels to improve motion characteristic.

The relationship between the using number of RAM components and logically formed line memory will be hereinafter described with reference to FIGS. 11A and 11B. Now, type 1 and type 2 exist as the RAM component.

Type 1: Bit width B=8 bits, depth W=64 stages

Type 2: Bit width B=16 bits, depth W=32 stages

These type 1 and 2 have the same area (8×64)=(16×32).

On the other hand, the line memory requires a bit depth P=5 bits and the number H of pixels of one line=90 pixels. In addition, three line circuits are required.

In FIG. 11A, line memories LM1, LM2 and LM3 are formed using the foregoing type 1 RAM component. In this case, the line memory must be configured using six RAM components 121 to 126. According to the foregoing configuration, wasteful areas are much as seen from the slanted area of the RAM components 121 to 126. On the contrary, in FIG. 11B, line memories LM1, LM2 and LM3 are formed using the foregoing type 2 RAM component. In this case, a circuit is realized using three RAM components 131, 132 and 133 without wasteful area.

As seen from the comparison between FIGS. 11A and 11B, the RAM component has a wide bit width, and thereby, several row line memories are effectively assigned. In other words, many line memories are formed using a few of RAM components as possible as can. By doing so, the apparatus using the line memory realized according the invention has the following advantages. Specifically, hardware cost is reduced, and also, power consumption is reduced.

Figure 12:
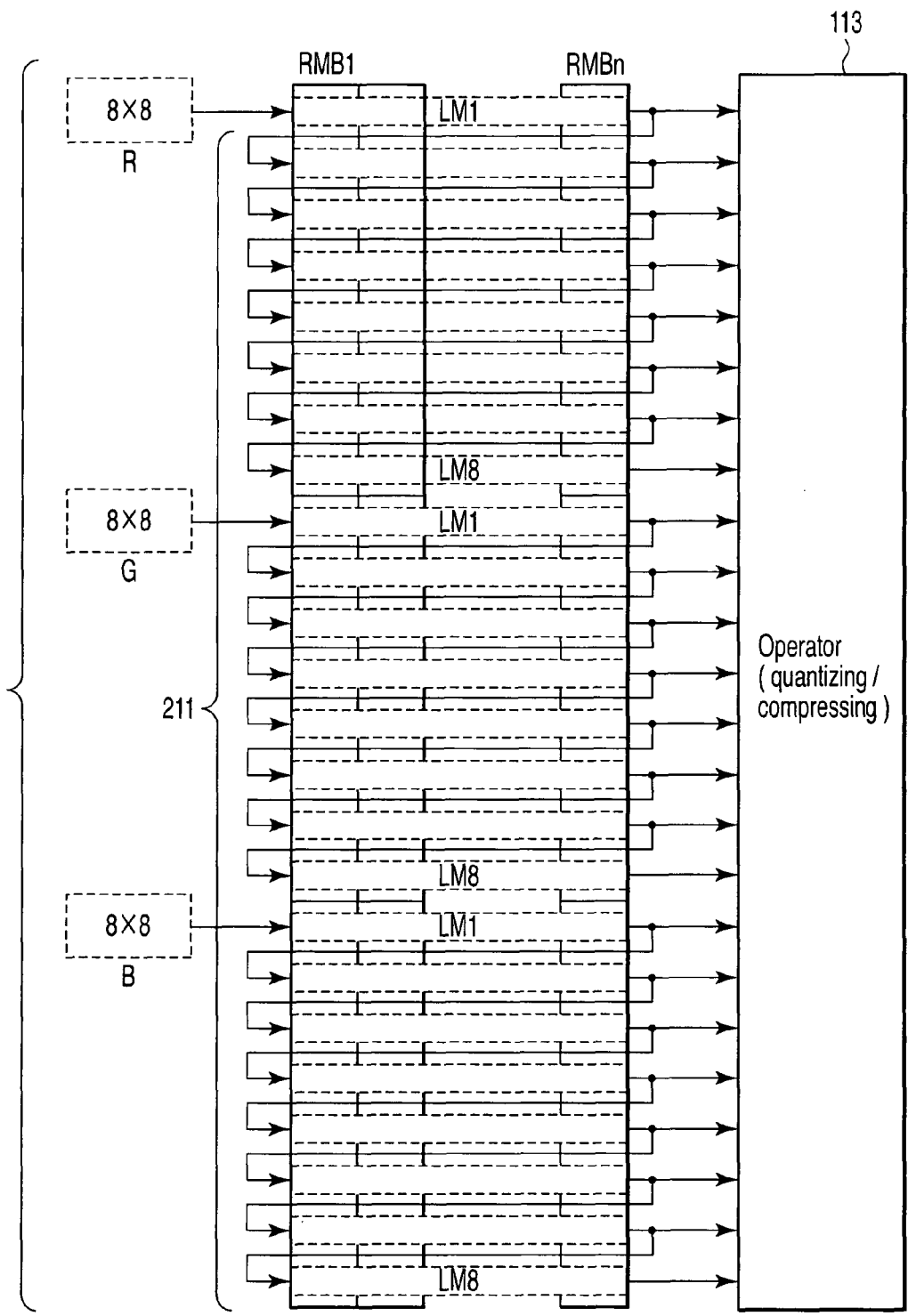
FIG. 12 is a circuit diagram showing the configuration of still another embodiment of the present invention.

FIG. 12 shows another example realizing the circuit shown in FIG. 6. This circuit is configured in a manner that RAM components RMB1 to RMBn are cascade-connected. By doing so, a line memory group 211 is formed. The difference from the circuit of FIG. 6 is as follows. Namely, RAM components are not independent as a RGB processing circuit. In other words, the number of using RAM components is reduced.

Figure 13:
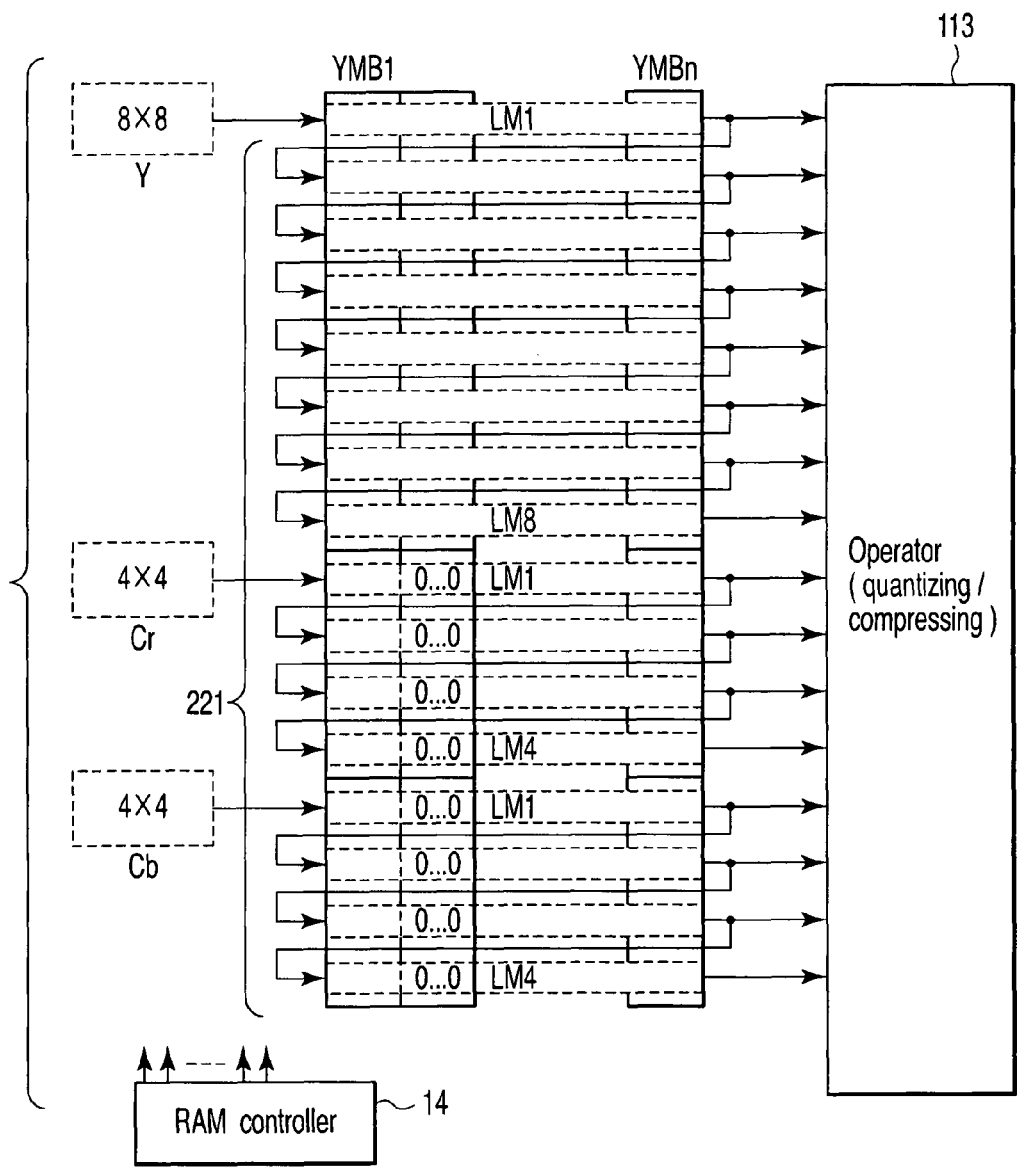
FIG. 13 is a circuit diagram showing the configuration of still another embodiment of the present invention.

FIG. 13 shows another example realizing the circuit shown in FIG. 5A. This circuit is configured in a manner that RAM components YMB1 to YMBn are cascade-connected. By doing so, a line memory group 221 is formed. The difference from the circuit of FIG. 5A is as follows. Namely, RAM components are not independent as Y processing circuit, CR processing circuit and Cb processing circuit. In other words, the number of using RAM components is reduced.

As is evident from the foregoing description, in order to form a target line memory group, combination of reducing the number of using RAM components is found. According to the combination, a single type RAM component is not always used. More flexibly, some types of RAM components are combined, and thereby, the following combination is possible. Basically, the RAM components are cascade-connected, and further, connected in parallel. As a result, according to the present invention, the optimum combination of RAM components is employed.

While certain embodiments of the inventions have been described, these embodiments have been presented by way of example only, and are not intended to limit the scope of the invention. Indeed, the novel methods and systems described herein may be embodied in variety of other forms; furthermore, various omissions, substitutions and changes in the form of the methods and systems described herein may be made without departing from the spirit of the inventions. The accompanying drawings claims and their equivalents are intended to cover such forms or modifications as would fall within the scope and spirit of the invention.

What is claimed is:

1. An apparatus including a first group of line memories for a luminance signal, a second group of line memories for a first color signal, and a third group of line memories for a second color signal, the apparatus comprising:

a plurality of RAM components each of which is defined by the number of bits in a bit width direction that is larger than in a width direction of one of the line memories, the number of bits in a word length direction of one of the RAM components is less than that in a row length of the one of the line memories, the RAM components being connected together in a cascade fashion from a first-stage to a last-stage of the RAM components, where the total number of bits in the word length direction of the RAM components is over the number of bits in the row length of the one of the line memories;

a first group of input parts for the luminance signal provided for the first-stage RAM component, a first group of output parts provided for the last-stage RAM component for the luminance signal, the output parts of the first group being connected in the cascade fashion to the input parts of the first group except an external Y signal input part, in order to form the first group of line memories;

a second group of input parts for the first color signal provided for the first-stage RAM component, a second group of output parts provided for the last-stage RAM component for the first color signal, the output parts of the second group being connected in the cascade fashion to the input parts of the second group except an external first color signal input part, in order to form the second group of line memories;

a third group of input parts for the second color signal provided for the first-stage RAM component, a third group of output parts provided for the last-stage RAM component for the second color signal, the output parts of the third group being connected in the cascade fashion to the input parts of the third group except an external second color signal input part, in order to form the third group of line memories; and a controller configured to control a write address and a read address of the RAM components to drive the line memories.

2. The apparatus of claim 1, wherein the first color signal and the second color signal include pixel macro blocks in order to synchronize processing timing of the luminance signal.

3. The apparatus of claim 2, wherein the pixel macro blocks are configured by data-all-zero.

4. The apparatus of claim 1, further comprising:
a tuner configured to receive a television signal;
a demodulator configured to demodulate an output of the tuner; and
a signal processor configured to convert image data from the demodulator by using the RAM components, wherein the signal processor includes a Y/C separator.

5. The apparatus of claim 1, further comprising:
a tuner configured to receive a television signal;
a demodulator configured to demodulate an output of the tuner; and
a signal processor configured to convert image data from the demodulator by using the RAM components, wherein the signal processor includes a horizontal and/or vertical filter.

6. The apparatus of claim 1, further comprising:
a tuner configured to receive a television signal;
a demodulator configured to demodulate an output of the tuner; and
a signal processor configured to convert image data from the demodulator by using the RAM components, wherein the signal processor includes a resolution converter.

7. The apparatus of claim 1, further comprising:
a tuner configured to receive a television signal;
a demodulator configured to demodulate an output of the tuner; and
a signal processor configured to convert image data from the demodulator by using the RAM components, wherein the signal processor includes a compressor/decoder.

8. The apparatus of claim 1, further comprising:
a tuner configured to receive a television signal;
a demodulator configured to demodulate an output of the tuner; and
a signal processor configured to convert image data from the demodulator by using the RAM components, wherein the signal processor includes an interpolation pixel generator.

* * * * *